(12) United States Patent
Zhang et al.

(10) Patent No.: US 11,164,920 B2
(45) Date of Patent: Nov. 2, 2021

(54) DISPLAY SUBSTRATE, METHOD OF MANUFACTURING SAME, AND DISPLAY DEVICE

(71) Applicant: BOE TECHNOLOGY GROUP CO., LTD., Beijing (CN)

(72) Inventors: Yuxin Zhang, Beijing (CN); Xinguo Li, Beijing (CN); Xinyin Wu, Beijing (CN); Hongfei Cheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 72 days.

(21) Appl. No.: 16/340,260

(22) PCT Filed: Nov. 1, 2018

(86) PCT No.: PCT/CN2018/113423
§ 371 (c)(1),
(2) Date: Apr. 8, 2019

(87) PCT Pub. No.: WO2019/161680
PCT Pub. Date: Aug. 29, 2019

(65) Prior Publication Data
US 2020/0395573 A1    Dec. 17, 2020

(30) Foreign Application Priority Data

Feb. 24, 2018 (CN) .......................... 201810156784.5

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 51/5253* (2013.01); *H01L 51/56* (2013.01)

(58) Field of Classification Search
CPC ....... H01L 51/56; H01L 27/3246–3258; H01L 51/5253–5256; H01L 27/3258
See application file for complete search history.

(56) References Cited

U.S. PATENT DOCUMENTS

2009/0058293 A1\* 3/2009 Maeda ................ H01L 27/3276
313/512
2013/0099221 A1\* 4/2013 Kawamura ............. H01L 51/52
257/40

(Continued)

FOREIGN PATENT DOCUMENTS

CN          103545320 A    1/2014
CN          105742322 A    7/2016

(Continued)

OTHER PUBLICATIONS

First Office Action for CN Appl. No. 201810156784.5, dated Mar. 26, 2020.

(Continued)

*Primary Examiner* — Errol V Fernandes
*Assistant Examiner* — Jeremy J Joy
(74) *Attorney, Agent, or Firm* — The Webb Law Firm (57) ABSTRACT

The present disclosure relates to a display substrate, a method of manufacturing the same, and a display substrate. The display substrate includes: a light-emitting portion located in a display region of the display substrate; one or more dams located in a non-display region of the display substrate, the non-display region surrounding the display region; a first stress absorbing portion arranged below at least one dam of the dams.

20 Claims, 4 Drawing Sheets

(56) References Cited

U.S. PATENT DOCUMENTS

| | | | | |
|---|---|---|---|---|
| 2016/0233248 A1* | 8/2016 | Kwak | ................ | H01L 27/1262 |
| 2016/0233280 A1* | 8/2016 | Cheng | ................ | H01L 27/3248 |
| 2016/0293884 A1* | 10/2016 | Zhang | ................... | H05B 45/60 |
| 2016/0307971 A1* | 10/2016 | Jeon | ................... | H01L 51/5246 |
| 2017/0018729 A1* | 1/2017 | Jiao | ........................ | H01L 51/56 |
| 2017/0031323 A1* | 2/2017 | Kim | ................... | H01L 27/3258 |
| 2017/0053973 A1* | 2/2017 | Park | ................... | H01L 27/3246 |
| 2017/0237038 A1* | 8/2017 | Kim | ................... | H01L 51/5253 |
| | | | | 257/40 |
| 2017/0288004 A1* | 10/2017 | Kim | ................... | H01L 27/3276 |
| 2017/0331058 A1* | 11/2017 | Seo | .......................... | G09F 9/30 |
| 2018/0159074 A1* | 6/2018 | Kim | ................... | H01L 51/5253 |
| 2018/0226454 A1* | 8/2018 | Liu | ....................... | H01L 27/323 |
| 2019/0198587 A1* | 6/2019 | Park | ..................... | G09G 3/3291 |
| 2020/0194697 A1* | 6/2020 | Wu | ..................... | H01L 27/3246 |
| 2020/0235194 A1* | 7/2020 | Ito | .......................... | H05B 33/22 |

FOREIGN PATENT DOCUMENTS

| | | | |
|---|---|---|---|
| CN | 105870147 A | | 8/2016 |
| CN | 106876428 A | * | 6/2017 |
| CN | 107275363 A | | 10/2017 |
| CN | 108258145 A | * | 7/2018 |
| CN | 108364987 A | | 8/2018 |
| GN | 106775173 A | | 5/2017 |

OTHER PUBLICATIONS

International Search Report and Written Opinion for International Appl. No. PCT/CN2018/113423, dated Feb. 1, 2019.

* cited by examiner

DISPLAY SUBSTRATE, METHOD OF MANUFACTURING SAME, AND DISPLAY DEVICE

CROSS-REFERENCE TO RELATED APPLICATIONS

The present application is a U.S. National Stage Application under 35 U.S.C. § 371 of International Patent Application No. PCT/CN2018/113423, filed on Nov. 1, 2018, which claims priority to CN Application No. 201810156784.5 as filed on Feb. 24, 2018. The disclosures of both applications are incorporated herein by reference in entirety.

TECHNICAL FIELD

The present disclosure relates to the field of display techniques, and in particular to a display substrate, a method of manufacturing the same, and a display device.

BACKGROUND

With the rapid development of display techniques, people's requirement for performance of display products becomes higher and higher. As a significant basis of the display device, the display substrate receives widespread attention.

During the manufacture of the display substrate, crackers are likely to occur on a package film layer of the display substrate during the cutting process, and thus to cause a failure of package and result in a poor display. Related techniques manufacture grooves on the periphery of the display substrate to prevent the crackers from being generated from the cutting and being propagated diffused to the display region.

SUMMARY

According to a first aspect of an embodiment of the present disclosure, a display panel is provided, comprising: a light-emitting portion located in a display region of the display substrate; one or more dams located in a non-display region of the display substrate, the non-display region surrounding the display region; and a first stress absorbing portion arranged below at least one dam of the dams.

In some embodiments, the dams include two dams, and the first stress absorbing portion is at least arranged below a dam of the two dams farther away from the light-emitting portion.

In some embodiments, the first stress absorbing portion includes a groove filled with an organic material.

In some embodiments, the organic material is identical with that of the dam.

In some embodiments, the display substrate further comprises: a second stress absorbing portion arranged below a pixel define layer of a region between the light-emitting portion and the dam.

In some embodiments, the display substrate further comprises: a third stress absorbing portion arranged below a pixel define layer in the light-emitting portion.

In some embodiments, at least one of the second stress absorbing portion or the third stress absorbing portion includes a groove filled with an organic material.

In some embodiments, the organic material is identical with that of the pixel define layer.

In some embodiments, a bottom of the groove is located in a base substrate of the display substrate.

In some embodiments, the display substrate further comprises: a package layer covering the light-emitting portion and the one or more dams; and a heat insulation protective layer arranged on the package layer.

In some embodiments, the heat insulation protective layer is a multi-layer structure.

In some embodiments, the heat insulation protective layer includes an inorganic heat insulation material.

In some embodiments, the display substrate further comprises: a first inorganic package layer and a second inorganic package layer covering the light-emitting portion and the one or more dams; and a fourth stress absorbing portion arranged between the first inorganic package layer and the second inorganic package layer.

In some embodiments, the display substrate further comprises: a package layer covering the light-emitting portion and the one or more dams, wherein, the package layer is discontinuous between the plurality of dams.

According to a second aspect to an embodiment of the present disclosure, a display device is provided, comprising the display substrate according to any above embodiment.

According to a third aspect of an embodiment of the present disclosure, a method of manufacturing a display substrate is provided, the display substrate comprising a display region and a non-display region surrounding the display region, the method comprising: arranging a light-emitting portion in the display region; arranging one or more dams in the non-display region; and arranging a stress absorbing portion below at least one dam of the dams.

In some embodiments, a material of the fourth stress absorbing portion comprises an organic material.

In some embodiments, the first stress absorbing portion includes a plurality of grooves, each of which penetrates the plurality of insulation layers.

Exemplary embodiments of the present disclosure are described in detail with reference to the drawings below, and other features and advantages thereof of the present disclosure will become more clear.

BRIEF DESCRIPTION OF THE DRAWINGS

The drawings, which serve as a part of the Specification, describe embodiments of the present disclosure, and used to explain the principles of the present disclosure along with the Specification.

With reference to the drawings, the present disclosure may be understood more clear according to the following detailed description. In particular.

It should be understood that the dimensions of the various parts shown in the drawings are not drawn in the actual scale. Further, the same or similar reference numerals denote the same or similar components.

DETAILED DESCRIPTION

Various exemplary embodiments of the present disclosure will now be described in detail with reference to the drawings. The description of the exemplary embodiments is merely illustrative, and is in no way intended to limit the invention. The present disclosure can be implemented in many different forms and is not limited to the embodiments described herein. The examples are provided to make the disclosure thorough and complete, and to fully express the scope of the present disclosure. It should be noted that the relative arrangement of the components and the components, the components of the materials, the numerical expressions and the numerical values set forth in the embodiments are to be construed as illustrative only and not as a limitation.

The words "first," "second," and similar terms used in the present disclosure do not denote any order, quantity, or importance, but are used to distinguish different parts. The words "including" or "comprising" and the like mean that the elements preceding the word include the elements listed after the word, and do not exclude the possibility of the other elements. "Upper", "lower", "left", "right", etc. are only used to indicate the relative positional relationship, and when the absolute position of the object to be described is changed, the relative positional relationship may also change accordingly.

In the present disclosure, when it is described that a particular device is located between the first device and the second device, there may be intervening devices between the particular device and the first device or the second device, or there may be no intervening devices. When it is described that a particular device is connected to other devices, that particular device can be directly connected to the other device without intervening devices, or without intervening devices directly connected to the other devices.

All terms (including technical or scientific terms) used in the present disclosure have the same meaning as understood by one of ordinary skill in the art to which this disclosure belongs, unless specifically defined otherwise. It should also be understood that terms defined in, for example, a general dictionary should be interpreted as having a meaning consistent with their meaning in the context of the related art, without the use of idealized or extremely formal meanings, unless explicitly stated herein. Defined like this.

Techniques, methods and apparatus known to those of ordinary skill in the relevant art may not be discussed in detail, but the techniques, methods and apparatus should be considered as part of the specification, where appropriate.

Figure 1:
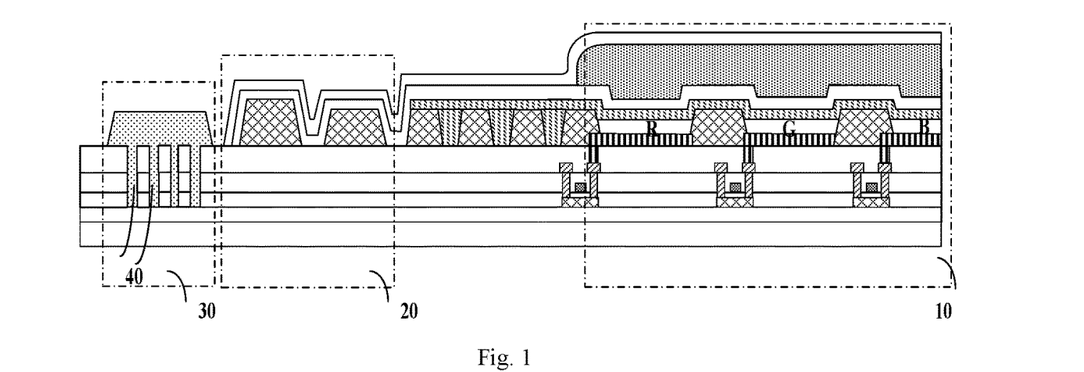
FIG. 1 is a structural diagram of the display substrate of related techniques.

FIG. 1 is a structural diagram of the display substrate of related techniques.

As shown in FIG. 1, the display substrate comprises a display region 10, a dam region 20 surrounding the display region, and a periphery 30 surrounding the dam region (i.e., a margin of the periphery). In FIG. 1, grooves 40 are generally arranged on the periphery 30 of the display substrate to prevent crackers from being generated from the cutting. It will make the frame of the display substrate wide, and thus frame narrowing cannot be realized.

To solve the aforementioned problem, the present disclosure proposes a technical solution of preventing crackers from generation and propagation while realizing frame narrowing.

According to some embodiments of the present disclosure, the display substrate comprises: a light-emitting portion located in a display region of the display substrate; one or more dams located in a non-display region of the display substrate; and a stress absorbing portion (namely "a first stress absorbing portion") arranged below at least one dam of the dams.

As compared with the arrangement of the grooves on the periphery of the display substrate (that is, outside the dam), the arrangement of the stress absorbing portion below at least one dam can effectively absorb a stress generated in the cutting process, thus preventing crackers from generation and propagation while realizing frame narrowing.

Figure 2:
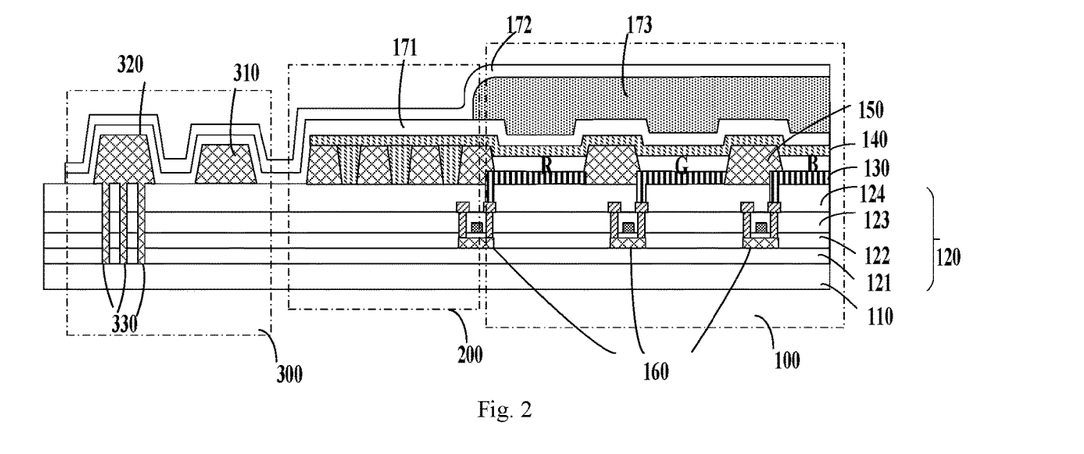
FIG. 2 is a structural diagram of the display substrate according to an embodiment of the present disclosure.

FIG. 2 is a structural diagram of the display substrate according to an embodiment of the present disclosure.

As shown in FIG. 2, the display substrate comprises a display region 100 and a non-display region surrounding the display region. The non-display region may include a first non-display region 200 and a second non-display region (i.e., dam region) 300. The first non-display region 200 surrounds the display region 100, and the second non-display region 300 surrounds the first non-display region 200.

In FIG. 2, a plurality of insulation layers 120 are arranged on the base substrate 110, and the plurality of insulation layers may sequentially include, e.g. a barrier layer 121, a gate insulation layer 122, an interlayer insulation layer 123, and a passivation layer 124. The display region and the non-display region each includes the base substrate 110 and the plurality of insulation layers 120.

In the display region, the light-emitting portion includes an anode 130, a cathode 140, and a light-emitting layer. The light-emitting layer includes different light-emitting units, e.g. R (red), G (green), and B (blue) light-emitting units located between the anode 130 and the cathode 140. The different light-emitting units R, and B are separated by a pixel define layer 150. The cathode 130 is connected to a Thin Film Transistor (TFT) 160 through vias. A package layer is arranged on the cathode 140. The package layer may include one or more inorganic package layers. For example, the inorganic package layer may include a first inorganic package layer 171 and a second inorganic package layer 172. The package layer may further include an organic package layer 173 arranged between the first inorganic package layer 171 and the second inorganic package layer 172.

The cathode 140 covers the display region 100 and extends from the display region 100 to the first non-display region 200 (namely a region between the dam region 300 and the display region 100). In the first non-display region 200, the cathode 140 is connected to leads (not shown)

through the vias arranged on the pixel define layer, and an electric signal of the cathode is led to a drive IC through the leads. The leads are located on the interlayer insulation layer 123, which is manufactured on the same layer as the source and drain layer, or on the passivation layer 124, which is manufactured on the same layer as the anode layer.

The inorganic package layer 171, 172 covers the display region 100, and further extends from the display region 100 to the first non-display region 200 and the second non-display region 300 (namely the dam region). In other words, the inorganic package layer covers the light-emitting portion and the dams as well as a region between the light-emitting portion and the dams.

FIG. 2 shows a case of two dams (a first dam 310 and a second dam 320), where a first stress absorbing portion 330 is arranged below a dam (namely the second dam 320) farther away from the light-emitting portion. It should be understood that, the embodiment of FIG. 2 is only an example. The embodiment of the present disclosure is also adapted for a case of one dam or more than two dams. Further, the embodiment of the present disclosure is also adapted for the case where the first stress absorbing portion is arranged below any dam (e.g. the first dam) other than the second dam.

In FIG. 2, "the first stress absorbing portion is arranged below the second dam" may be understood as "the first stress absorbing portion is just below the second dam", or "the first stress absorbing portion is arranged on a side of the second dam far away from the package layer". It should be understood that, "the first stress absorbing portion is arranged below the second dam" may be further understood as "projections of the first stress absorbing portion and the dam at least partially overlap each other in a direction perpendicular to the substrate, and the first stress absorbing portion is closer to the substrate than the second dam". Here, "below" or other similar expression may be explained here in a similar way.

In some embodiments, the first stress absorbing portion may take the form of a groove. Due to the presence of a groove, a stress for example, generated in the cutting process, can be absorbed, thus preventing crackers from generation and propagation in the display substrate, particularly in the inorganic layer.

The number, shape and depth of the groove are not limited, and may be selected as actually required. In some embodiments, the groove may go deep into the base substrate of the display substrate, that is, a bottom of the groove is located in the base substrate. A deeper groove can absorb the stress more effectively, thus further preventing cracks from generation and propagation.

In some other embodiments, the groove of the first stress absorbing portion may be further filled with an organic material. Since the organic material can better absorb the stress, the first stress absorbing portion can absorb the stress more effectively. Herein, the filled organic material may be an organic high molecular material, such as polyimide, polyurea, polyamide acid, polyacrylic acid, polyester, polyethylene, or polypropylene. The filled organic material may be a single material or a mixture of various materials.

In some embodiments, the organic material of the first stress absorbing portion is identical with that of the dam. For example, both the first stress absorbing portion and the dam may use a material of polyimide. In other words, the first stress absorbing portion may be integrated with the dam, as shown in FIG. 2. In this way, no other organic material may be additionally employed, the process becomes simpler, and the costs become lower.

Figure 3:
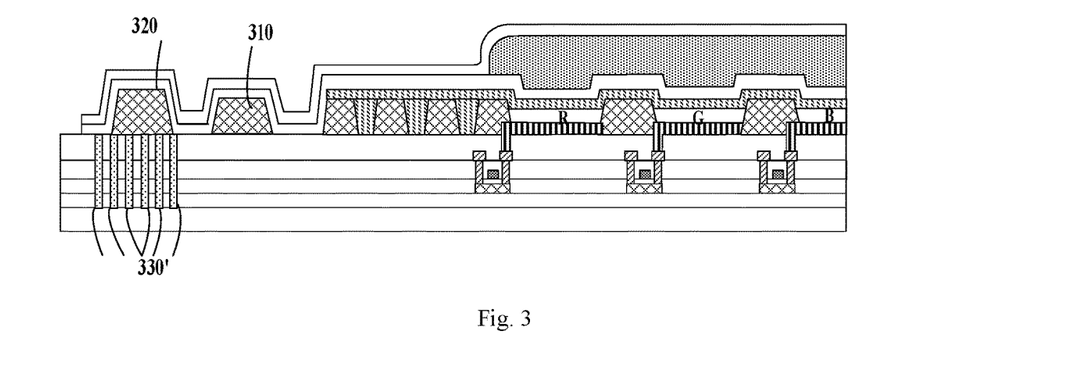
FIG. 3 is a structural diagram of the first stress absorbing portion according to an embodiment of the present disclosure.

In some other embodiments, the first stress absorbing portion is not integrated with the dam, but the groove is filled with an organic material different from that of the dam. FIG. 3 is a structural diagram of the first stress absorbing portion according to an embodiment of the present disclosure. As shown in FIG. 3, the first stress absorbing portion employs a different material from the dam, for example, an organic material having a better stress-absorptive effect. In this way, properties of different materials may be fully utilized, and the stress-absorbing function of the stress absorbing portion may be brought into full role.

As shown in FIG. 3, projections of a first stress absorbing portion 330' and a second dam 320 at least partially overlap each other in a direction perpendicular to the base substrate. That is, there are a portion of grooves of the first stress absorbing portion that are located just below the second dam, and there are another portion of the grooves that are located obliquely below the second dam. By using such a structure, the process becomes more flexible, and does not require precise alignment, which may reduce complexity of the process.

Figure 4:
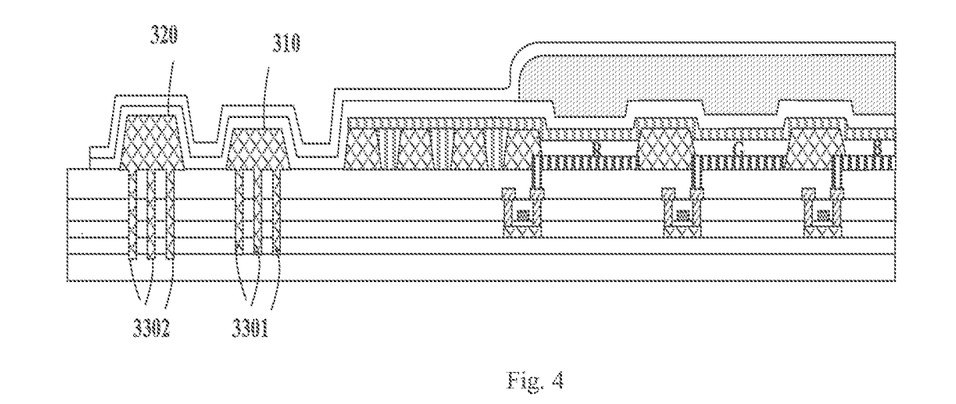
FIG. 4 is a structural diagram of the first stress absorbing portion according to another embodiment of the present disclosure.

FIG. 4 is a structural diagram of the first stress absorbing portion according to another embodiment of the present disclosure. FIG. 4 differs from FIG. 2 in comprising two first stress absorbing portions which are arranged below two dams respectively.

As shown in FIG. 4, a first stress absorbing portion 3301 is arranged below the first dam 310, and a second stress absorbing portion 3302 is arranged blow the second dam 320. Using such an arrangement from outside to inside, a stress of the display substrate as generated in the cutting or bending process can be absorbed more effectively, and a redundant arrangement of the control of crackers can be also realized.

Figure 5:
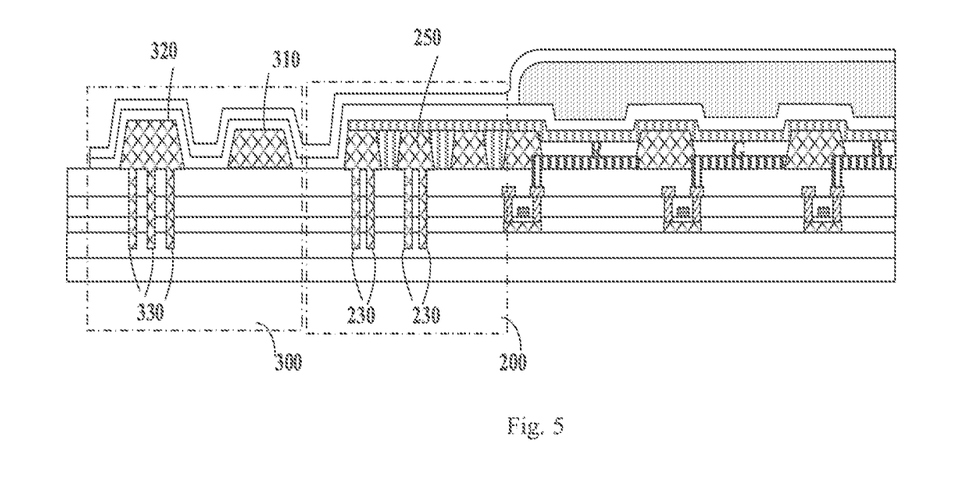
FIG. 5 is a structural diagram of the display substrate according to another embodiment of the present disclosure.

FIG. 5 is a structural diagram of the display substrate according to another embodiment of the present disclosure. FIG. 5 differs from FIG. 2 in arranging a second stress absorbing portion 230 in the first non-display region 200 in addition to arranging a first stress absorbing portion 330 in the second non-display region (dam region) 300.

As shown in FIG. 5, the second stress absorbing portion 230 is arranged below the pixel define layer 250 of the first non-display region 200, that is, located below a region between the light-emitting portion and the dam. FIG. 5 shows that the second stress absorbing portion is arranged below the pixel define layer. It should be understood that, the second stress absorbing portion may be also arranged below all the pixel define layers of the first non-display region.

In the aforementioned embodiment, by further arranging the stress absorbing portion below the first non-display region, a stress of the display substrate as generated in the processing process can be absorbed more effectively. Moreover, by arranging layers from outside to inside, a redundant arrangement of the control of crackers can be further realized.

Figure 6:
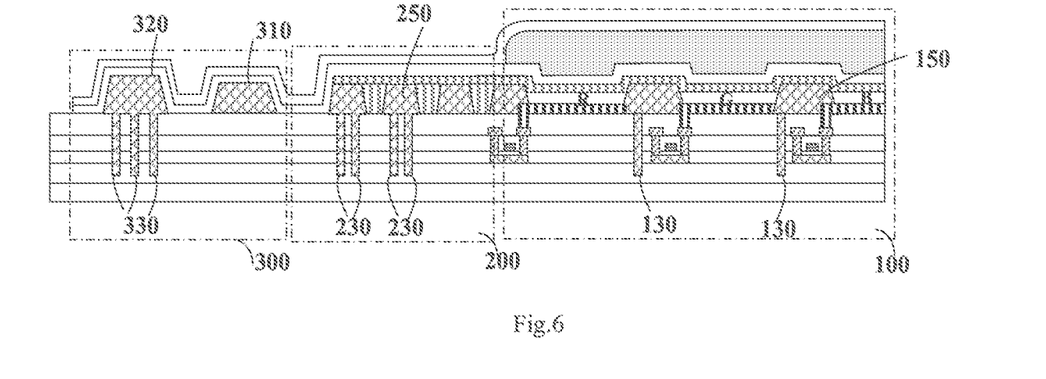
FIG. 6 is a structural diagram of the display substrate according to a further embodiment of the present disclosure.

FIG. 6 is a structural diagram of the display substrate according to a further embodiment of the present disclosure. FIG. 6 differs from FIG. 5 in further arranging a third stress absorbing portion 130 in the display region 100.

As shown in FIG. 6, the third stress absorbing portion 130 is arranged below the pixel define layer 150 in the display region. FIG. 6 shows that the third stress absorbing portion is arranged below all the pixel define layers. It should understood that, the third stress absorbing portion may be also arranged below a portion of the pixel define layers.

In the aforementioned embodiment, by further arranging the stress absorbing portion below the display region, a stress of the display substrate as generated in the processing process can be absorbed more effectively. Furthermore, by arranging the stress absorbing portions from outside to inside, a stress of the display substrate as generated in the cutting or bending process can be absorbed more effectively, and a redundant arrangement of the control of crackers can be further realized.

In some embodiments, similar to the first stress absorbing portion and the second stress absorbing portion, the third stress absorbing portion may also take the form of groove. The number, shape and depth of the groove are not limited, and may be selected as actually required. For example, the groove may be arranged a full circle surrounding the display region 100 or arranged locally. In some embodiments, the groove may go deep into the base substrate of the display substrate, that is, a bottom of the groove is located in the base substrate. A deeper groove can absorb the stress more effective, and thus further preventing the crackers from generation and propagation.

In some other embodiments, the groove of at least one of the second stress absorbing portion or the third stress absorbing portion is filled with an organic material, such that the stress can be absorbed more effectively. Similar to the first stress absorbing portion, the filling organic material may be an organic high molecular material, such as polyimide, polyurea, polyamide acid, polyacrylic acid, polyester, polyethylene, or polypropylene. The filling organic material may be a single material or a mixture of various materials.

In some embodiments, the second stress absorbing portion and the third stress absorbing portion may be integrated with the pixel define layer or arranged separately from the pixel define layer, and the materials may be identical or different. When at least one of the second stress absorbing portion or the third stress absorbing portion is integrated with the pixel define layer, no other organic material is additionally employed, the process becomes simpler, and the costs become lower.

Figure 7:
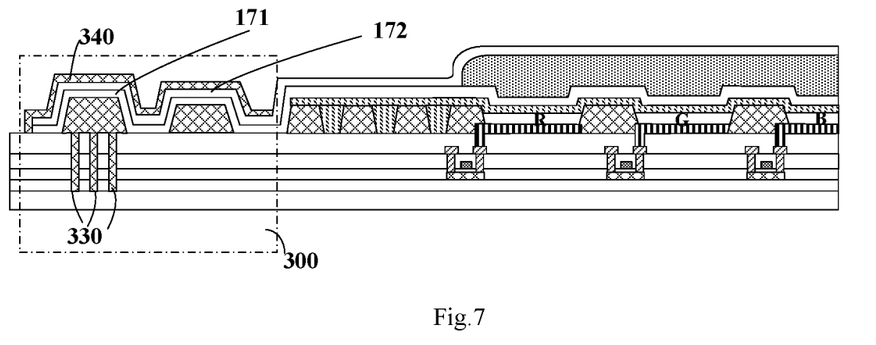
FIG. 7 is a structural diagram of the display substrate according to a yet further embodiment of the present disclosure.

FIG. 7 is a structural diagram of the display substrate according to some further embodiments of the present disclosure. FIG. 7 differs from FIG. 2 in further arranging a heat insulation protective layer on the package layer.

As shown in FIG. 7, the heat insulation protective layer 340 may be only arranged on the inorganic package layer 171, 172 that covers the dam. Here, "the heat insulation protective layer is arranged on the inorganic package layer" may be understood as "the heat insulation protective layer covers the inorganic package layer" or "the heat insulation protective layer is arranged on a side of the inorganic package layer far away from the substrate".

The heat insulation protective layer may be an organic heat insulation material or an inorganic heat insulation material. In some embodiments, the heat insulation protective layer includes an inorganic heat insulation material, e.g. an inorganic layer which is made of one or more materials of $SiO_x$, $SiN_x$, $SiC_xN_y$, $SiO_xN_y$, $AlO_x$, $SnO_2$, $AlN$, $MgF_2$, $CaF_2$, $In_2O_3$, or ITO.

In the aforementioned embodiment, by arranging the heat insulation protective layer, heat as generated in the cutting process can prevented from damaging the inorganic layer of the display substrate.

Figure 8:
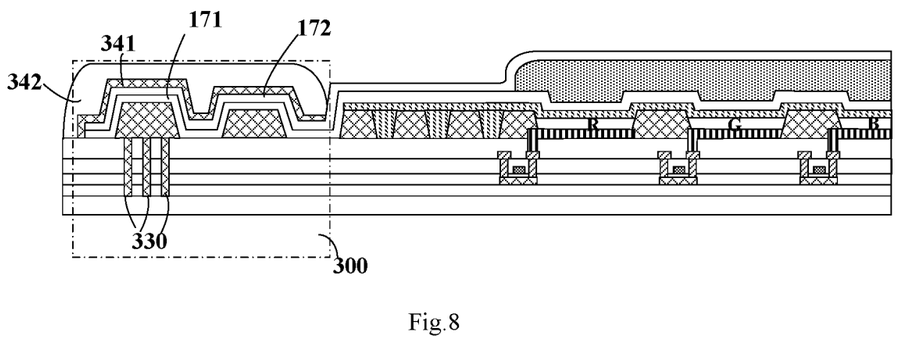
FIG. 8 is a structural diagram of the heat insulation protective layer according to an embodiment of the present disclosure.

FIG. 8 is a structural diagram of the heat insulation protective layer according to an embodiment of the present disclosure. FIG. 8 differs from FIG. 7 in that the heat insulation protective layer is a multilayer structure.

As shown in FIG. 8, the heat insulation protective layer includes two layers, e.g. a heat insulation protective layer 341 and a heat insulation protective layer 342. By forming the multilayer heat insulation protective layer from various kinds of materials, properties of different materials may be fully utilized, and the heat insulation protecting function of the heat insulation protective layer may be brought into full role.

Figure 9:
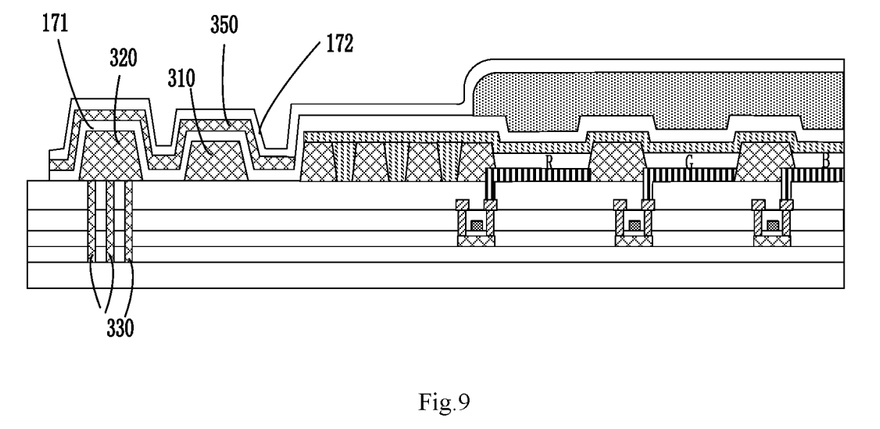
FIG. 9 is a structural diagram of the display substrate according to a yet another embodiment of the present disclosure.

FIG. 9 is a structural diagram of the display substrate according to a yet another embodiment of the present disclosure. FIG. 9 differs from FIG. 2 in that, the display substrate further comprises: a fourth stress absorbing portion 350 arranged between the first inorganic package layer 171 and the second inorganic package layer 172.

As shown in FIG. 9, the fourth stress absorbing portion 350 may be only arranged between the first inorganic package layer 171 and the second inorganic package layer 172 that cover the dam 310, 320, respectively. The material of fourth stress absorbing portion may be an organic material. In some embodiments, the material of the fourth stress absorbing portion may be identical with that of the organic package layer. For example, the material of the organic package layer may be selected from one or several of bisphenol A epoxy oligomer, polyethylene glycol glycidyl ether, glycidyl alkyl ether, ε-caprolactone modified 3,4-epoxycyclohexylmethyl 3',4'-epoxycyclohexane carboxylate, 3,4-Epoxycyclohexenylmethyl-3',4'-epoxycyclohexenyl carboxylate. In the aforementioned embodiment, by further arranging the stress absorbing portion between the package layers, a stress of the display substrate as generated in the processing process can be absorbed more effectively, and by arranging different stress absorbing portions in different situation, a redundant arrangement of the control of crackers can also be further realized.

Figure 10:
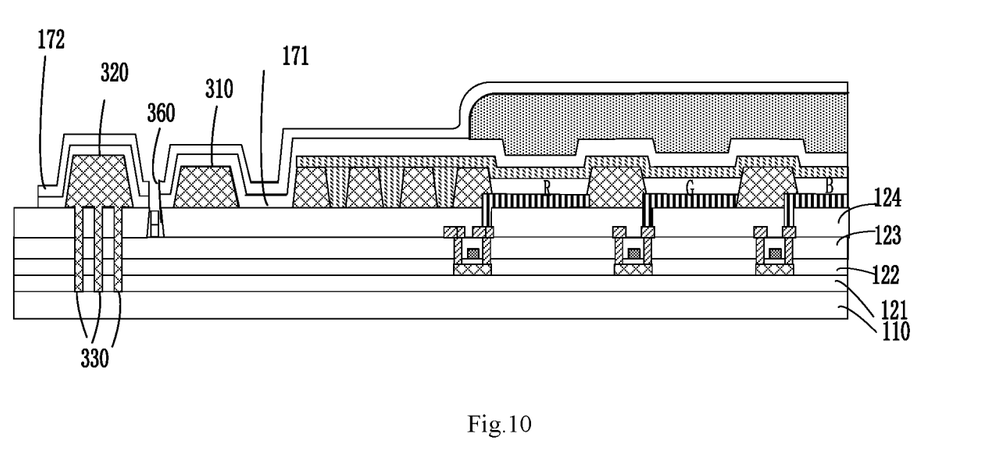
FIG. 10 is a structural diagram of the inorganic package layer according to an embodiment of the present disclosure.

FIG. 10 is a structural diagram of the inorganic package layer according to an embodiment of the present disclosure. FIG. 10 differs from FIG. 2 in that the package layers are discontinuous between the plurality of dams.

As shown in FIG. 10, the first inorganic package layer 171 and the second inorganic package layer 172 each have an opening 360 between the first dam 310 and the second dam 320. The opening, as a trapezoid, goes deep into a passivation layer 124 of the plurality of insulation layers. It should be understood that, the number, shape, and depth of the opening are not limited to the case as shown in FIG. 10, and may be selected by those skilled in the art as actually required. For example, the opening may go deep into the interlayer insulation layer.

In the aforementioned embodiments, by making the inorganic package layer that covers the dam discontinuous between the dams, a stress of the display substrate as generated in the processing process can be absorbed more effectively, and performance of edge package can be guaranteed.

An embodiment of the present disclosure further provides a display device, comprising any aforementioned display substrate. The display device may be mobile phone, tablet, television, monitor, laptop, digital photo frame, navigator, or any product or part having a displaying function.

Figure 11:
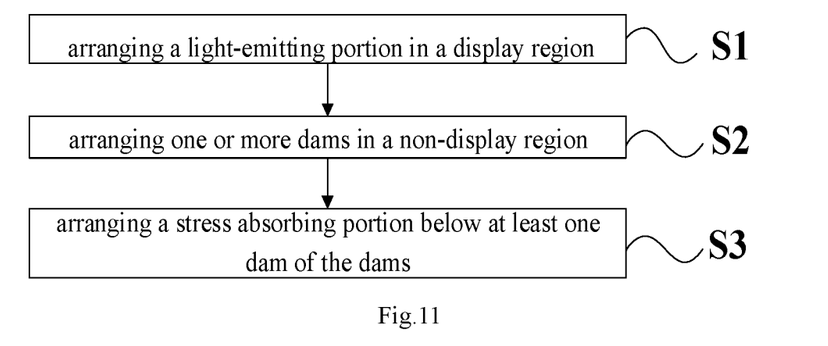
FIG. 11 is a flow chart of the method of manufacturing the display substrate according to an embodiment of the present disclosure.

FIG. 11 is a flow chart of the method of manufacturing the display substrate according to an embodiment of the present disclosure.

As shown in FIG. 11, the method of manufacturing the display substrate comprises: step S1, arranging a light-emitting portion in a display region; step S2, arranging one or more dams in a non-display region; and step S3, arranging a stress absorbing portion below at least one dam of the dams.

By referring to FIGS. 2-10, some embodiments of the method of manufacturing the display substrate are described below.

Firstly, a plurality of insulation layers may be sequentially formed on the substrate. For example, the barrier layer 121, the gate insulation layer 122, the interlayer insulation layer 123, and the passivation layer 124 are sequentially deposited on the base substrate 110. For the base substrate and the plurality of insulation layers, those skilled in the art may select suitable materials and depositing processes as actually required.

Secondly, the display region and the non-display regions may be respectively formed by patterning or other process.

In the display region 100, the anode 130, the light-emitting layer, and the cathode 140 may be sequentially formed on the plurality of insulation layers. Also, the pixel define layer 150 may be formed between different light-emitting units of the light-emitting layer R, B such that different light-emitting units are separated. The TFT 160 connected to the anode 130 may be also formed in the plurality of insulation layers.

In the first non-display region 200, the pixel define layer 250 may be firstly formed on the plurality of insulation layers. Next, the pixel define layers are etched to form an opening. Then, a cathode material is deposited. The deposited cathode material fills the opening, and covers the pixel define layers. It should be understood that, the pixel define layer 250 in the first non-display region 200 and the pixel define layer 150 in the display region 100 may be formed simultaneously. Similarly, the first non-display region 200 and the cathode 140 in the display region 100 may be also formed simultaneously.

In the second non-display region 300, a plurality of grooves may be etched in the plurality of insulation layers to form the first stress absorbing portion 330. The etching process is, e.g. dry etching, and the dry-etching gas may be $CF_4/SF_6/NF_3/CH_2F_2/CHF_3$. The grooves as shown in FIG. 2 only go deep into the insulation layer closest to the base substrate. However, it should be understood that, the number, shape, and depth of the grooves are not limited to the case as shown in FIG. 2. When a groove is are formed by the etching method, the bottom of a groove may be etched into the base substrate such that the groove go deep into the substrate, as shown in, e.g. FIG. 4. A deeper groove can absorb the stress more effectively, thus further preventing the cracker from generation and propagation.

In some embodiments, the groove of the stress absorbing portion may be filled with an organic material such that the stress can be absorbed more effectively. The filled inorganic material may be an organic high molecular material, such as polyimide, polyurea, polyamide acid, polyacrylic acid, polyester, polyethylene, or polypropylene. The filled organic material may be a single material or a mixture of various kinds of materials.

The organic material that fills the grooves may be the same as the material of the dam. In such case, the material of the dam may be deposited after the groove is formed, and the first stress absorbing portion is integrated with the dam, as shown in FIG. 2.

In some other embodiments, the organic material that fills the groove may be different from the material of the dam. In such case, the dam may be separately formed after the groove is filled, that is, the first stress absorbing portion is not integrated with the dam, as shown in FIG. 3

In some embodiments, the first stress absorbing portion 3301 may be arranged below the first dam 310 in addition to that the first stress absorbing portion 3302 is arranged below the second dam 320 (as shown in FIG. 4). Alternatively, in addition to that the first stress absorbing portion is arranged below the dam, the second stress absorbing portion 230 is further arranged below the pixel define layer 250 of the first non-display region 200 (as shown in FIG. 5). Also, the third stress absorbing portion 130 may be further arranged below the pixel define layer 150 in the display region 100 (as shown in FIG. 6).

It should be understood that, all of the first stress absorbing portion below the first dam in FIG. 4, the second stress absorbing portion in FIG. 5, the third stress absorbing portion in FIG. 6, and the first stress absorbing portion in FIGS. 7-10 may be formed using a similar process in the aforementioned embodiments.

Figure 12:
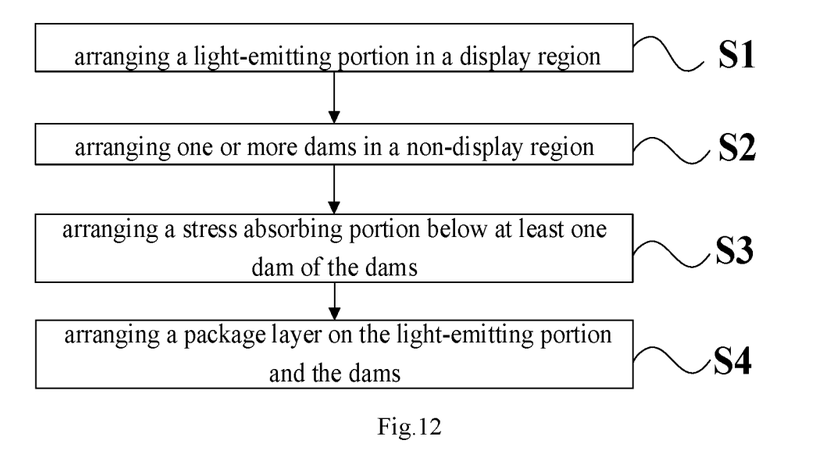
FIG. 12 is a flow chart of the method of manufacturing the display substrate according to another embodiment of the present disclosure.

FIG. 12 is a flow chart of the method of manufacturing the display substrate according to another embodiment of the present disclosure. FIG. 12 differs from FIG. 11 in that, the method further comprises: step S4, arranging a package layer on the light-emitting portion and the dam.

By referring to FIGS. 2 and 7-10, some other embodiments of the method of manufacturing the display substrate are described below.

After main parts of the display region and the non-display region are formed using the method of FIG. 11, the package layer is formed. The package layer covers both the display region and the non-display region, namely the light-emitting portion and the dam, as well as a region between the light-emitting portion and the dam. As shown in FIG. 2, the package layer may include the first inorganic package layer 171 and the second inorganic package layer 172. Also, the organic package layer 173 may be arranged between the first inorganic package layer 171 and the second inorganic package layer 172 of the display region 100.

In some embodiments, the heat insulation protective layer 340 may be arranged on the inorganic package layer that covers the dam, as shown in FIG. 7. For example, an inorganic film layer including one or more materials of $SiO_x$, $SiN_x$, $SiC_xN_y$, $SiO_xN_y$, $AlO_x$, $SnO_2$, $MgF_2$, $CaF_2$, $In_2O_3$, or ITO may be formed on the inorganic package layer as the heat insulation protective layer.

The heat insulation protective layer may also be a multilayer structure, such that properties of different materials may be fully utilized, and the function of the heat insulation protective layer may be brought into full role. For example, a plurality of thin film layers made of various inorganic materials may be formed on the inorganic package layer, e.g. the heat insulation protective layers 341 and 342 as shown in FIG. 8.

In some embodiments, the fourth stress absorbing portion 350 may be also arranged between the first inorganic package layer 171 and the second inorganic package layer 172, as shown in FIG. 9. For example, an organic material layer may be formed as the fourth stress absorbing portion 350, after the first inorganic package layer 171 is formed and before the second inorganic package layer 172 is formed. The organic material herein may be identical with the material of the organic package layer.

In some other embodiments, the plurality of insulation layers below the region between the plurality of dams may be etched to form an opening, before the package layer is formed. As shown in FIG. 10, the opening 360 is a trapezoid that goes deep into the passivation layer. It should be understood that, the number, shape and depth of the opening is not limited to the case as shown in FIG. 10, and may be selected by those skilled in the art as actually required.

Due to the presence of the opening, the film formation of the package layer below the trapezoidal opening is blocked, and thus the package layer is broken. That is, the formed package layer is discontinuous between the plurality of dams. In this way, performance of edge package can be fully guaranteed.

So far, various embodiments of the present disclosure have been described in detail. In order to avoid obscuring the concepts of the present disclosure, some details known in the art are not described. Those skilled in the art can fully understand how to implement the technical solutions disclosed herein according to the above description.

While some specific embodiments of the present disclosure have been described in detail by way of example, it should be understood that those skilled in the art will appreciate that the above embodiments may be modified or substituted for some of the technical features without departing from the scope and spirit of the disclosure. The scope of the disclosure is defined by the appended claims.

What is claimed is:

1. A display substrate, comprising:
   a light-emitting portion located in a display region of the display substrate;
   one or more dams located in a non-display region of the display substrate, the non-display region surrounding the display region, wherein the one or more dams comprises a plurality of dams;
   a first stress absorbing portion arranged below at least one dam of the plurality of dams; and
   a package layer covering the light-emitting portion and the plurality of dams, wherein the package layer is discontinuous between the plurality of dams and has an opening between adjacent dams of the plurality of dams.

2. The display substrate according to claim 1, wherein the plurality of dams include two dams, and the first stress absorbing portion is at least arranged below a dam of the two dams farther away from the light-emitting portion.

3. The display substrate according to claim 1, wherein the first stress absorbing portion includes a groove filled with an organic material.

4. The display substrate according to claim 3, wherein the organic material is identical with that of the at least one dam of the dams.

5. The display substrate according to claim 3, wherein a bottom of the groove is located in a base substrate of the display substrate.

6. The display substrate according to claim 1, further comprising:
   a second stress absorbing portion arranged below a pixel define layer in the non-display region.

7. The display substrate according to claim 6, wherein the second stress absorbing portion includes a groove filled with an organic material.

8. The display substrate according to claim 1, further comprising: a third stress absorbing portion arranged below a pixel define layer in the display region.

9. The display substrate according to claim 8, wherein the third stress absorbing portion includes a groove filled with an organic material.

10. The display substrate according to claim 9, wherein the organic material is identical with that of the pixel define layer.

11. The display substrate according to claim 1, wherein the package layer includes a first organic package layer and a second organic package layer; and further comprising:
    a fourth stress absorbing portion arranged between the first inorganic package layer and the second inorganic package layer.

12. The display substrate according to claim 11, wherein a material of the fourth stress absorbing portion comprises an organic material.

13. The display substrate according to claim 1, further comprising: a base substrate and a plurality of insulation layers located on the base substrate, wherein the at least one dam of the plurality of dams is arranged on the plurality of insulation layers, the first stress absorbing portion is arranged in the plurality of insulation layers, and projections of the dam and the first stress absorbing portion at least partially overlap each other in a direction perpendicular to the base substrate.

14. The display substrate according to claim 13, wherein the first stress absorbing portion includes a plurality of grooves, each of which penetrates the plurality of insulation layers.

15. A display device comprising the display substrate according to claim 1.

16. A display substrate comprising:
    a light emitting portion located in a display region of the display substrate;
    one or more dams located in a non-display region of the display substrate, the non-display region surrounding the display region;
    a first stress absorbing portion arranged below at least one dam of the dams;
    a package layer covering the light-emitting portion and the one or more dams; and
    a heat insulation protective layer arranged on the package layer and only in the non-display region.

17. The display substrate according to claim 16, wherein the heat insulation protective layer is a multi-layer structure.

18. The display substrate according to claim 16, wherein the heat insulation protective layer includes an inorganic heat insulation material.

19. A method of manufacturing a display substrate, the display substrate comprising a display region and a non-display region surrounding the display region, the method comprising:
    arranging a light-emitting portion in the display region;
    arranging one or more dams in the non-display region, wherein the one or more dams comprises a plurality of dams;
    arranging a first stress absorbing portion below at least one dam of the plurality of dams; and
    arranging a package layer covering the light-emitting portion and the plurality of dams, wherein the package layer is discontinuous between the plurality of dams and has an opening between adjacent dams of the plurality of dams.

20. The method according to claim 19, wherein the first stress absorbing portion includes a groove filled with an organic material, and the first stress absorbing portion is integrated with the dam.

* * * * *

UNITED STATES PATENT AND TRADEMARK OFFICE
CERTIFICATE OF CORRECTION

PATENT NO. : 11,164,920 B2
APPLICATION NO. : 16/340260
DATED : November 2, 2021
INVENTOR(S) : Zhang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 172 days.

Signed and Sealed this
Thirty-first Day of January, 2023

Katherine Kelly Vidal
*Director of the United States Patent and Trademark Office*